United States Patent [19]

Tanabe et al.

[11] Patent Number: 4,513,209
[45] Date of Patent: Apr. 23, 1985

[54] LEVEL DETECTOR

[75] Inventors: Kenzo Tanabe; Junji Suzuki, both of Katano, Japan

[73] Assignee: Matsushita Electric Industrial Co., Ltd., Osaka, Japan

[21] Appl. No.: 348,311

[22] Filed: Feb. 11, 1982

[30] Foreign Application Priority Data

Feb. 16, 1981 [JP] Japan .................. 56-22065

[51] Int. Cl.$^3$ .................. H03K 5/153; H03K 5/22
[52] U.S. Cl. .................. 307/350; 307/355; 328/26
[58] Field of Search .................. 328/26; 307/350, 355, 307/260, 261; 330/257

[56] References Cited

U.S. PATENT DOCUMENTS

| | | | |
|---|---|---|---|
| 3,290,520 | 12/1966 | Wennik | 307/350 |
| 4,053,796 | 10/1977 | van de Plassche | 328/26 |
| 4,187,537 | 2/1980 | Avicola et al. | 328/26 |
| 4,336,586 | 6/1982 | Lunn | 328/26 |
| 4,410,858 | 10/1983 | Kusakabe | 330/257 |

FOREIGN PATENT DOCUMENTS 2422534 6/1947 Fed. Rep. of Germany .

OTHER PUBLICATIONS

An Integrated AM Stereo Decoder, IEEE Transactions on Consumer Electronics, vol. CE-27, No. 3, pp. 254-259.

Primary Examiner—Stanley D. Miller
Assistant Examiner—Timothy P. Callahan
Attorney, Agent, or Firm—Wenderoth, Lind & Ponack

[57] ABSTRACT

A level detector having good linearity and a high detection efficiency is arranged so as to be small in size and inexpensive to produce, thereby being well suited for use in a semiconductor integrated circuit. The detector employs a common emitter amplifier having two transistors connected in parallel so that odd order harmonic distortion components are mutually eliminated while DC and even order harmonic components appear at the collector thereof. The detector further includes a high impedance load for the two parallel connected transistors. The load is composed of a transistor normally biased in its active region so as to thereby raise the detection efficiency.

2 Claims, 2 Drawing Figures

LEVEL DETECTOR

BACKGROUND OF THE INVENTION

This invention relates to a level detector applicable to a radio receiver.

Generally, it is desirable for a level detector to have the following characteristics:

(i) good linearity (low distortion factor),
(ii) high detection efficiency,
(iii) good stability with respect to temperature variations, and
(iv) a low manufacturing cost and a small size.

A transistor detector is a well-known type of high-efficiency detector.

The conventional detector using transistors performs level detection at the base emitter junction of a transistor, so that an amplified and detected output signal is obtained at the collector thereof. This kind of detector, however, is difficult to use for realizing both a good linearity characteristic a high detection efficiency due to the following reasons:

Firstly, a heavy non-linear distortion is caused by using the non-linear characteristics of the base emitter junction of the transistor.

Secondly, it is difficult to provide a load resistor, having a high resistance value, in the monolithic semiconductor chip for realizing a high detection efficiency.

SUMMARY OF THE INVENTION

An object of the invention is to provide a level detector which can solve the above-noted problems and has a good linearity (low distortion factor) and a high detection efficiency and is small in size and inexpensive to produce, thereby being suited for a semiconductor integrated circuit.

In detail, a level detector of the invention firstly employs, emitter type amplifier comprising two transistors connected in parallel so that odd order harmonic distortion components are mutually eliminated, and DC and even order harmonic components only appear at the collector thereof, and secondly, is composed of a high impedance load realized by a transistor which is biased in its active region, thereby raising the detection efficiency.

BRIEF DESCRIPTION OF DRAWINGS

Other objects and aspects of the invention will become apparent from the following description of an embodiment with reference to the accompanying drawings in which.

DESCRIPTION OF THE PREFERRED EMBODIMENT

Figure 1:
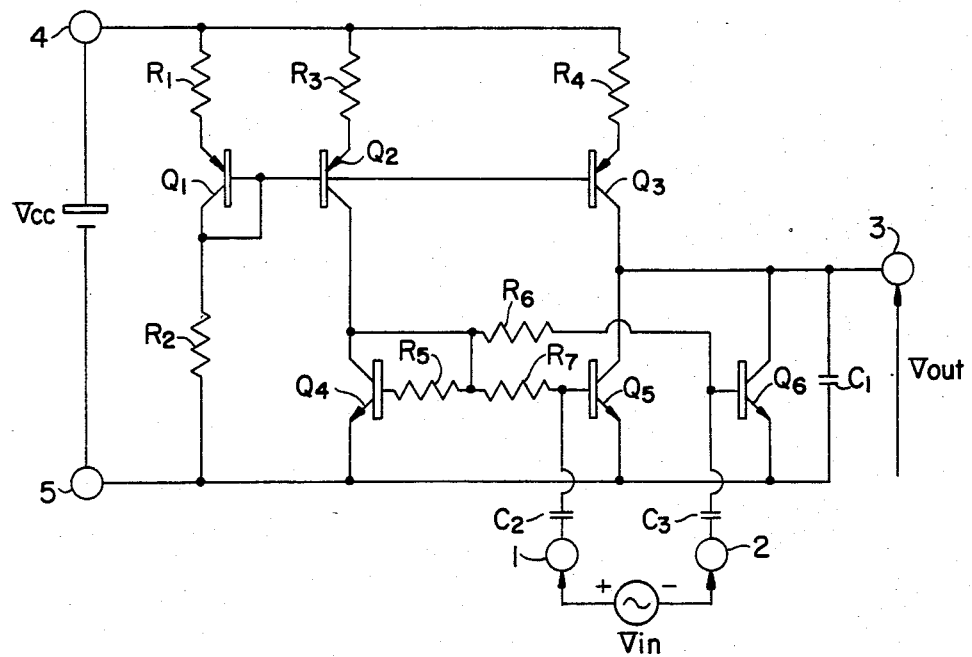
FIG. 1 is a circuit diagram of a level detector of the present invention, formed in the integrated circuit.

Referring to FIG. 1, two AC signals, whose level is to be detected, and having the same signal level and having the opposite polarity are introduced to terminals 1 and 2, respectively. Reference numeral 3 designates an output terminal at the level detector of the invention, numeral 4 designates a power supply terminal for the DC power source, and numeral 5 designates a ground terminal.

Transistors $Q_1$, $Q_2$ and $Q_3$ are PNP type, their bases being connected altogether. The emitters of the transistors $Q_1$, $Q_2$ and $Q_3$ are connected to the power supply terminal 4 through bias resistors $R_1$, $R_3$ and $R_4$, respectively. The base and collector of transistor $Q_1$ are connected together the collector thereof being grounded through resistor $R_2$. The collectors of transistors $Q_2$ and $Q_3$ are respectively connected to the collector of transistor $Q_4$ and the collectors of NPN transistors $Q_5$ and $Q_6$ which are connected together. NPN transistors $Q_4$, $Q_5$ and $Q_6$ are grounded at the emitters thereof and connected at the bases to the collector of transistor $Q_4$ through base-bias resistors $R_5$, $R_6$ and $R_7$, respectively; the collector of transistor $Q_4$, as noted above, being connected to the collector of transistor $Q_2$. The bases of transistors $Q_5$ and $Q_6$ are connected to the input terminals 1 and 2 through AC signal coupling capacitors $C_2$ and $C_3$ respectively and the collectors of transistors $Q_3$, $Q_5$ and $Q_6$ are connected to the detector output terminal 3 and also grounded through a filtering capacitor $C_1$.

Next, the operation of the above mentioned circuit will be described.

Transistor $Q_1$ and resistors $R_1$ and $R_2$ construct a base-bias circuit with respect to transistors $Q_2$ and $Q_3$, the emitter currents of transistors $Q_2$ and $Q_3$ being determined by emitter resistors $R_3$ and $R_4$ thereof and the base-bias circuit. It is to be noted that the transistor $Q_1$ is used for compensating for the temperature dependant characteristics of the base emitter junctions of the transistors $Q_2$ and $Q_3$.

Transistors $Q_4$, $Q_5$ and $Q_6$ and resistors $R_5$, $R_6$ and $R_7$, constitute a current mirror circuit. Therefore, the collector bias currents of transistors $Q_5$ and $Q_6$ is determined by the collector current of transistor $Q_4$. On the other hand, since the collector of transistor $Q_4$ is connected to the collector of transistor $Q_2$, as mentioned before, the collector current in transistor $Q_4$ is nearly equal to that of transistor $Q_2$, whereby it is seen that the collector currents of transistors $Q_5$ and $Q_6$ are determined by transistor $Q_2$. To simplify the explanation, if it is assumed that transistors $Q_4$, $Q_5$, and $Q_6$ have the same characteristics, and it if is assumed that resistors $R_5$, $R_6$ and $R_7$ are equal in resistance, then the collector currents of transistors $Q_4$, $Q_5$ and $Q_6$ are nearly equal to that of transistor $Q_2$.

As seen from the circuit diagram in FIG. 1, the sum of the collector currents of transistors $Q_5$ and $Q_6$ is equal to the collector current of transistor $Q_3$.

Now, when the circuit is so designed so that the resistance value of resistor $R_4$ is made considerably smaller than that of resistor $R_3$, so that the emitter current of transistor $Q_3$ becomes larger than the sum of the collector currents of transistors $Q_5$ and $Q_6$ (the sum determined by the emitter current of transistor $Q_2$), transistor $Q_3$ has its operating point in its saturation region.

This invention is characterized firstly in that the operating point of the transistor $Q_3$, when an input signal is not present or too small, is set to be in its saturation region.

Figure 2:
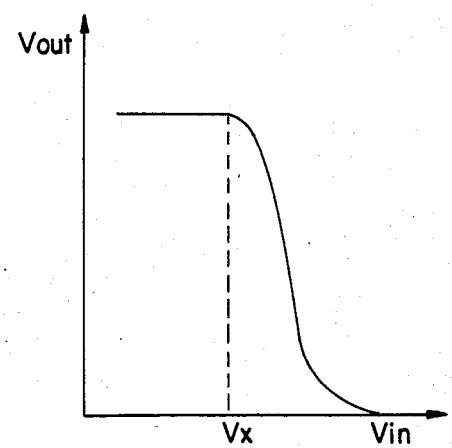
FIG. 2 is a graph of level detection output voltage from an output terminal with respect to an AC input signal.

FIG. 2 shows the change of level detection output voltage $V_{out}$ from an output terminal 3 in FIG. 1 with respect to an AC input signal voltage $V_{in}$ applied between terminals 1 and 2 in FIG. 1. The level detection output voltage $V_{out}$ is high when the AC input signal voltage $V_{in}$ is smaller than $V_x$ because the transistor $Q_3$ operates in its saturation region.

Next, the operation of the circuit shown in FIG. 1 will be described under the condition where two AC input signals having the same signal level and the opposite polarity are applied to terminals 1 and 2, respectively. The AC input signals are applied to the bases of transistors $Q_5$ and $Q_6$ through coupling capacitors $C_2$ and $C_3$, respectively.

It is well known that a rectified output signal is obtained at the collectors of transistors $Q_5$ and $Q_6$ when the applied AC input signals are so large that they overdrive the base to emitter junctions thereof.

The alternating current component included in the aforesaid rectified output signal is removed by the aforesaid filtering capacitor $C_1$, so that only a rectified DC component corresponding to the level of the input AC signals is applied to the collector of transistor $Q_3$. Hence, the collector current of transistor $Q_3$ increases as the AC input level increases, so that the operating point of transistor $Q_3$ is changed from its saturation region into its active region.

At this point, transistor $Q_3$ acts as a load resistor, having a large resistance value, for the transistors $Q_5$ and $Q_6$.

Referring to FIG. 2, the operating point of transistor $Q_3$, as shown, is driven into the active region in the vicinity of an input level $V_x$.

When the level of the input AC signal $V_{in}$ applied between the input terminals 1 and 2 is large enough to overdrive the base-emitter junctions of the transistors $Q_5$ and $Q_6$, a rectified DC signal is produced at the collectors of the transistors $Q_5$ and $Q_6$. The rectified DC signal increases with the further increase of the input AC signal $V_{in}$, so that the operating point of the transistor $Q_3$ moves toward the active region of the transistor $Q_3$. And finally, when the level of the input AC signal $V_{in}$ reaches the level equal to $V_x$, the operating point of the transistor $Q_3$ reaches the active region of the transistor $Q_3$. Accordingly, the collector of the transistor $Q_3$, or the output voltage $V_{out}$, decreases as shown in FIG. 2.

The level detector of the invention, which provides rectifying transistors $Q_5$ and $Q_6$ in parallel and which needs two AC input signals of opposite polarity with same signal level, may be simplified by omitting either transistor $Q_5$ or $Q_6$. However, in this instance, since the input signals to be rectified are usually intermediate frequency signals, in some cases, more than two signals close in frequency exist as said intermediate frequency signals according to a certain receiving condition.

In the above-noted case, a rectifier circuit which omits either transistor $Q_5$ and $Q_6$ generates high intermodulation products with a high input level due to the non-linearity of the base-emitter junction of transistor $Q_6$ and $Q_5$. Some of these intermodulation products are irregularly coupled to the input of the intermediate frequency amplifier and detector which causes a distorted sound.

This invention is characterized in that the transistors $Q_5$ and $Q_6$ are provided in parallel so as to eliminate the odd order intermodulation product, which is very harmful as mentioned above, by balancing out said odd order intermodulation products at their collectors.

The level detector of the invention is advantageous in:

(1) having a low distortion factor, because of a pair of ground emitter—amplifiers, having the collectors thereby connected together and which are the basic elements of the detector, are constructed essentially so as not to generate odd order harmonic distortion;

(2) having a high detection efficiency, because the active load transistor, used as the load resistor, has a high load impedance;

(3) having good stability with respect to the temperature variations, because the operating point of the detector is determined by the temperature compensated current mirror circuit; and (4) being easy to realize in a monolithic integrated semiconductor chip.

In addition, although the collector currents of transistors $Q_5$ and $Q_6$ in FIG. 1 are determined by transistor $Q_4$ according to the principle of the current mirror for the convenience of explanation, other circuit configurations could of course be desirably adoptive within the scope of this invention.

What is claimed is:

1. A level detector comprising:
   first and second transistors of a first conductivity type, said first and second transistors having their bases connected together;
   a third transistor of a second conductivity type opposite to that of said first conductivity type;
   a resistor connected between said third transistor's base and collector;
   fourth and fifth transistors of said second conductivity type, said fourth and fifth transistors having their collectors connected together;
   a DC bias circuit operatively connected to said bases of said first and second transistors for supplying a DC bias thereto;
   wherein said first transistor's collector is connected to said third transistor's collector, said fourth and fifth transistors' bases are respectively connected to said third transistor's collector through separate resistors, said first and second transistors' emitters are respectively connected to a first terminal of a DC power supply through separate resistors, said third and fourth and fifth transistors' emitters are connected to a second terminal of said power supply, said second transistor's collector is connected to said fourth and said fifth transistors' collectors;
   wherein AC signals having the same amplitude but of opposite polarities are respectively supplied to said fourth and fifth transistors' bases and a level detected output signal is provided at said common collectors of said second and fourth and fifth transistors, and wherein said second transistor is biased in its saturation region when said AC signals are of zero amplitude levels.

2. A level detector as recited in claim 1, wherein said DC bias circuit comprises an additional transistor having its base connected to its collector and having its collector connected to said second terminal of said DC power supply through a resistor and having its emitter connnected to said first terminal of said DC power supply through another resistor and having its collector supplying said DC bias to said bases of said first and second transistors.

* * * * *